(12) United States Patent
Adams et al.

(10) Patent No.: US 8,754,665 B2
(45) Date of Patent: Jun. 17, 2014

(54) DUAL STAGE VACUUM CHAMBER WITH FULL CIRCUIT BOARD SUPPORT

(75) Inventors: Clement C. Adams, Maple Grove, MN (US); Matthew Eric Lavik, Maple Grove, MN (US); Gregory J. Michalko, Maple Grove, MN (US); Stuart Eickhoff, Maple Grove, MN (US)

(73) Assignee: Circuit Check, Inc., Maple Grove, MN (US)

( * ) Notice: Subject to any disclaimer, the term of this patent is extended or adjusted under 35 U.S.C. 154(b) by 161 days.

(21) Appl. No.: 13/444,237

(22) Filed: Apr. 11, 2012

(65) Prior Publication Data

US 2013/0271171 A1 Oct. 17, 2013

(51) Int. Cl.
*G01R 31/20* (2006.01)
(52) U.S. Cl.
USPC .......................... 324/750.25; 29/864; 29/827
(58) Field of Classification Search
USPC .................. 324/750.18–750.26, 500, 755.03; 29/846, 705, 827; 702/117
See application file for complete search history.

(56) References Cited

U.S. PATENT DOCUMENTS

| | | | |
|---|---|---|---|
| 6,441,606 B1 * | 8/2002 | Caldwell et al. | 324/750.05 |
| 6,879,870 B2 * | 4/2005 | Shannon et al. | 700/121 |
| 7,348,787 B2 * | 3/2008 | Harwood et al. | 324/750.14 |
| 7,616,017 B2 * | 11/2009 | Cowan et al. | 324/750.13 |

* cited by examiner

*Primary Examiner* — Melissa Koval
*Assistant Examiner* — Trung Nguyen
(74) *Attorney, Agent, or Firm* — Altera Law Group, LLC (57) ABSTRACT

A dual-stage fixture for a circuit tester includes a slide plate that can be slid between at least a first position and a second position. In the first position, an upper stripper plate is spring-loaded, and a full set of test probes, including both long-stroke and short-stroke probes, can contact the circuit board or UUT (unit under test). In the second position, the upper stripper plate becomes fixed in position, and only the long-stroke probes can contact the circuit board. The fixed positioning of the upper stripper plate prevents the short-stroke probes from contacting the circuit board even when there is unbalanced loading of probe pressure between the top and bottom of the circuit board, thereby preventing transient signals from interfering with testing. In addition, a vacuum is applied in this position during a non-powered test.

17 Claims, 8 Drawing Sheets

DUAL STAGE VACUUM CHAMBER WITH FULL CIRCUIT BOARD SUPPORT

TECHNICAL FIELD

This disclosure relates generally to test equipment. More particularly, the disclosure relates to test equipment for circuit boards.

BACKGROUND

Circuit board testers are used for testing a variety of circuit boards or UUT (unit under test which may be something other than a circuit board—the terms will be used interchangeably to refer to all possibilities) or similar devices to assure that the circuit boards operate as intended. In at least one type of circuit board tester, such as Agilent Model No. 3070, Series 3, a separate device, referred to as a fixture, is used to position the circuit board such that a plurality of electrically conductive probes (which are part of, or coupled to, the tester) contact predetermined components or positions of the circuit board. The particular components or positions that are contacted by the test or probes depend on the tests that are desired. When the probes are in contact with the desired locations on the circuit board, electrical signals with predetermined parameters (e.g., predetermined magnitudes or patterns of current, voltage frequency, phase, and the like) are applied by the tester, typically under control of a computer, to certain of the probes. Some or all of the probes are used to measure the performance or response of the circuit board (i.e., to measure electrical parameters at some or all of the probes contacting the circuit board). In this way, it is possible to rapidly perform a number of tests or measurements characterizing the performance of the circuit board while simulating the conditions the circuit board would have, or could have, during actual use. Although it is possible to use these types of tests and testing devices for a variety of possible purposes (such as "spot checking" selected circuit boards at a production facility, testing circuit boards which may be malfunctioning, testing prototype circuit boards as part of a design program, and the like), in at least some applications, circuit board testing is used to provide quality assurance on all or substantially all products of a given type or class which are produced by a company.

Some circuit board testers use a vacuum fixture that uses atmospheric pressure, specifically a vacuum, to drive a platen with a combination of spring-loaded probes and circuit board push down features to press against the circuit board and press it against another platen with a field of spring-loaded test probes. In some circuit board testers, all of the probes contact the circuit board simultaneously. While vacuum systems are effective, they are quite complex and expensive to manufacture.

Some circuit board testers use what is known as a dual-stage test fixture. A dual-stage test fixture typically has spring-loaded test probes that are of two different lengths, known as long-stroke probes and short-stroke probes. As a result, different test cycles can involve different test probes contacting the circuit board. For example, during a powered in-circuit test, both the long- and short-stroke probes contact the circuit board being tested at the same time. On the other hand, during a non-powered test, only the long-stroke probes contact the circuit board. Contacting the circuit board with only the long-stroke probes allows different circuits on the circuit board to be tested without introducing electrical interference by contacting the circuit board with all of the probes.

In some conventional circuit board testers employing dual-stage test fixtures, however, during the non-powered test, both sides of the circuit board may not be fully supported. As a result, some of the short-stroke probes can contact the circuit board during the non-powered test, potentially inadequate contact force and poor signal quality and interference. This interference can cause the test to fail and may cause electrical damage to the electronic components of the circuit board. Failure to fully support the circuit board at all times may cause the circuit board to be subject to deformations typically caused by vacuum pressure differentials that can lead to stress fractures in the solder connections or in the electronic components on the circuit board. By fully supporting the board/UUT, and eliminating pressure stresses thereon, the quality of test is improved, while simultaneously reducing the complexity of the tester.

SUMMARY OF THE DISCLOSURE

According to various example embodiments, a dual-stage fixture for a circuit tester includes a slide plate that can be slid between at least a first position and a second position. In the first position, an upper stripper plate is spring-loaded, and a full set of test probes, including both long-stroke and short-stroke probes, can contact the circuit board. In the second position, the upper stripper plate becomes fixed in position, and only the long-stroke probes can contact the circuit board. The fixed positioning of the upper stripper plate prevents the short-stroke probes from contacting the circuit board even when there is unbalanced loading of probe pressure between the top and bottom of the circuit board, thereby preventing transient signals from interfering with testing. In addition, a vacuum is applied in this position during a non-powered test.

One embodiment is directed to a circuit tester for testing a circuit board. The circuit tester includes a housing having first and second parts pivotally connected at one edge to be hinged together, or simply that the parts can be brought closer together not necessarily by pivoting, such as on rails or pins. A push plate is mounted to the first part of the housing, and a bottom probe plate is mounted proximate the second part of the housing. The bottom probe plate has a first set of first test probes having a first length and a second set of second test probes having a second length shorter than the first length. The circuit tester also includes a jumper plate that is mounted to the push plate via a plurality of rigid support members. Each rigid support member is connected to the jumper plate via a respective spring or other bias member. An upper stripper plate is mounted to the jumper plate via a plurality of resilient members. The stripper plate can also be unitary with the probe plate so reference to the probe plate can refer to a plate having both functions. A lower plate is mounted to the bottom probe plate. A first slide plate having apertures formed in it is movable between a first position and a second position. The first slide plate has a surface that contacts the rigid support members when the first slide plate is in the first position. When the first slide plate is in the second position, the rigid support members are received by the apertures. When the first slide plate is in the first position, the first test probes and the second test probes contact the circuit board. When the first slide plate is in the second position, only the first test probes contact the circuit board.

Another embodiment is directed to a method of using the circuit tester to test a circuit board. The method involves placing the circuit board in the circuit tester. A vacuum is applied to the circuit tester when the first slide plate is in the first position, thereby causing the first test probes and the second test probes to contact the circuit board. An in-circuit test is performed on the circuit board, and the vacuum is released. The first slide plate is then moved from the first position to the second position. The vacuum is applied to the circuit tester when the first slide plate is in the second position, thereby causing only the first test probes to contact the circuit board. A so called functional test is then performed on the circuit board.

Also disclosed is a method for testing a circuit board or UUT (unit under test), the method in a circuit tester having at least some of these elements: first and second parts capable of being brought closer together; a push plate mounted to the first part; a probe plate adjacent the push plate for first and second test probes; a rigid support member attached to either plate at one end; a slide plate laterally movable between a first position and a second position, the slide plate having a surface that contacts the rigid support members when the slide plate is in the first position, the slide plate or probe plate having an apertures for receiving the rigid support member in the second position. The method involves placing the UUT in the circuit tester. A force is applied to the circuit tester when the slide plate is in the first position, thereby causing the first test probes and the second test probes to contact the UUT. An in-circuit test is performed on the UUT. At least some force is released. The slide plate is moved from the first position to the second position. The force is applied to the circuit tester when the slide plate is in the second position, thereby causing only the first test probes to contact the UUT. A functional test is performed on the UUT.

The disclosed embodiments may realize certain advantages. For instance, with the vacuum applied during the non-powered test, the spring-loaded long-stroke test probes can make a more positive electrical contact with the circuit board. By contrast, in some conventional circuit testers that use mechanical means to bring the test probes into contact with the circuit board, the mechanical forces exerted on the circuit board can cause the probe plates bearing the test probes to bow away from the circuit board, reducing the probe travel and, in turn, limiting successful electrical contact.

Further, in the disclosed embodiments, the upper stripper plate is spring-loaded during the powered test, but becomes fixed in place during the non-powered test. As a result, the fixed plate provides a positive delta between the long- and short-stroke test probes, preventing the short-stroke probes from contacting the circuit board during the non-powered test. In addition, the fixed plate provides an even and regulated pressure against the circuit board when it is being tested, preventing strain events that can cause structural damage to the circuit board and its electronic components.

DETAILED DESCRIPTION

The inventive subject matter is described with specificity to meet statutory requirements. However, the description itself is not intended to limit the scope of this patent. Rather, it is contemplated that the claimed subject matter might also be embodied in other ways, to include different steps or combinations of steps similar to the ones described in this document, in conjunction with other present or future technologies.

Dual stage testing devices are known in the art. To aid the reader in understanding the basic technology prior to this disclosure, reference should be had to U.S. Pat. No. 8,004, 300, the disclosure of which is incorporated by reference and shows a testing environment. FIG. 1 of that patent shows a testing device in perspective with a UUT (unit under test) shown as a circuit board. The UUT is removably and rigidly attached to, and optionally, spaced apart from, a support plate or mounting plate with or without spacer elements. In this configuration, the electrical contacts on the UUT that are to be tested face upward, and are accessible to various probes from above or below plate 18. There may also be probes from underneath the UUT. In this case, probes from the top are illustrated. Note that the circuit board and fixture on which it is mounted are considered one for the purpose of this application, though they are likely to be separate components. We refer to the circuit board whether or not it includes a fixture. The probes may apply and measure voltages or currents at various locations on the UUT, and are controlled mechanically and electrically by the tester. A computer, not shown, may control the tester and may record data from the tests.

According to various disclosed embodiments, a dual-stage fixture uses atmospheric pressure, e.g., a vacuum, as a driving force to press a push plate down. A jumper plate is mounted on rods, called jumper standoffs, to the push plate. The jumper plate may or may not have spring-loaded probes. Any such spring-loaded probes can be long-stroke, short-stroke, or a combination of long- and short-stroke probes. The jumper plate is mounted in such a way as to allow it to move loosely in the x- and y-axes. Movement in the z-axis is variable.

Mounted to the jumper plate is a smaller plate, called an upper stripper plate, with clearance holes through which the test probes can protrude. The upper stripper plate is spring-loaded through the use of pushpin assemblies. As a pushpin assembly is depressed, a plunger assembly protrudes through a rear assembly by an equal amount to that which it is depressed. The circuit board lies upon a similarly mounted stripper plate above a platen of long- and short-stroke test probes.

In a first test cycle, when a force, such as from a vacuum or other source of force such as mechanical, electromagnetic, or pneumatic, all of which will simply be referred to as vacuum, is applied to the dual-stage fixture, the push plate is drawn down, forcing the upper stripper plate to contact the circuit board. As a result, the circuit board is pressed down against the lower probe field. As the push plate is drawn down, all of the spring-loaded probes make contact with the circuit board and the circuit board is tested. The vacuum is then released.

In a second test cycle, a plate, called a slide plate, that is mounted to the underside of the push plate is slid from a first position to a second position. The slide plate has a number of clearance cutouts for jumper plate standoffs that are mounted on the back of the jumper plate. When the slide plate is moved into one position, the jumper plate's standoffs can contact the surface of the slide plate. When the slide plate is moved into a different position, on the other hand, the standoffs align with the clearance cutouts and contact the bottom of the push plate. This, in effect, varies the mounting height of the jumper plate, thus allowing either all of the probes to contact the circuit board or just a subset, e.g., only the long-stroke probes.

The upper stripper plate rests upon spring-loaded pushpin assemblies. As the pushpin assembly's plunger is depressed, the plunger's shaft protrudes an equal distance from the opposite side. Mounted on the slide plate are buttons that align with the spring-loaded pushpins when the clearance cutouts align with the jumper plate standoffs. When the slide plate's buttons align with the spring-loaded pushpins, they force the spring-loaded pushpins to lock in place, thereby losing their spring characteristics. Accordingly, in this configuration, the upper stripper plate is fixed in position and prevents the short-stroke probes from contacting the circuit board. Even though the short-stroke probes do not contact the circuit board in this configuration, the circuit board is still pressed against the long-stroke probes of either the upper probe field or the lower probe field by a solid surface. A non-powered functional test is performed. When the functional test is completed, the vacuum is released, and all of the probes are disengaged.

Figure 1:
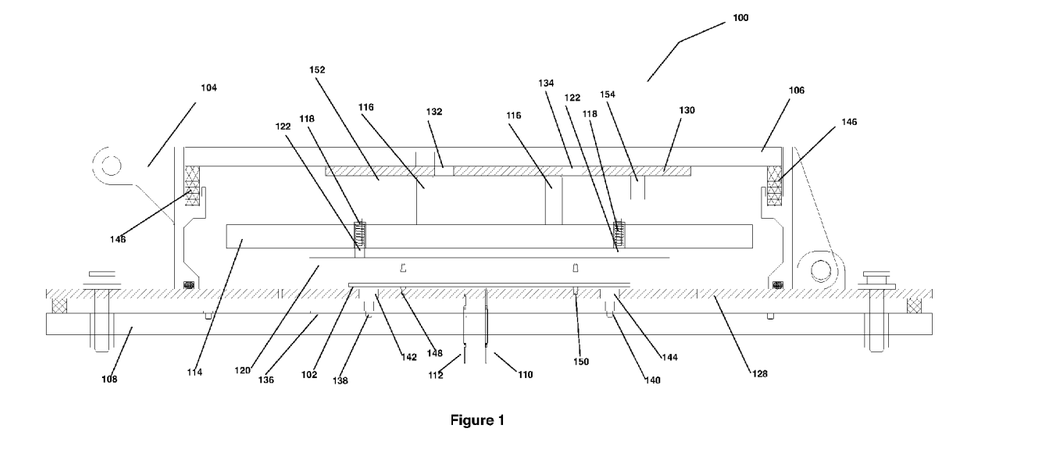
FIG. 1 illustrates a side plan view in section of a circuit tester in a rest configuration according to one embodiment.
Figure 4:
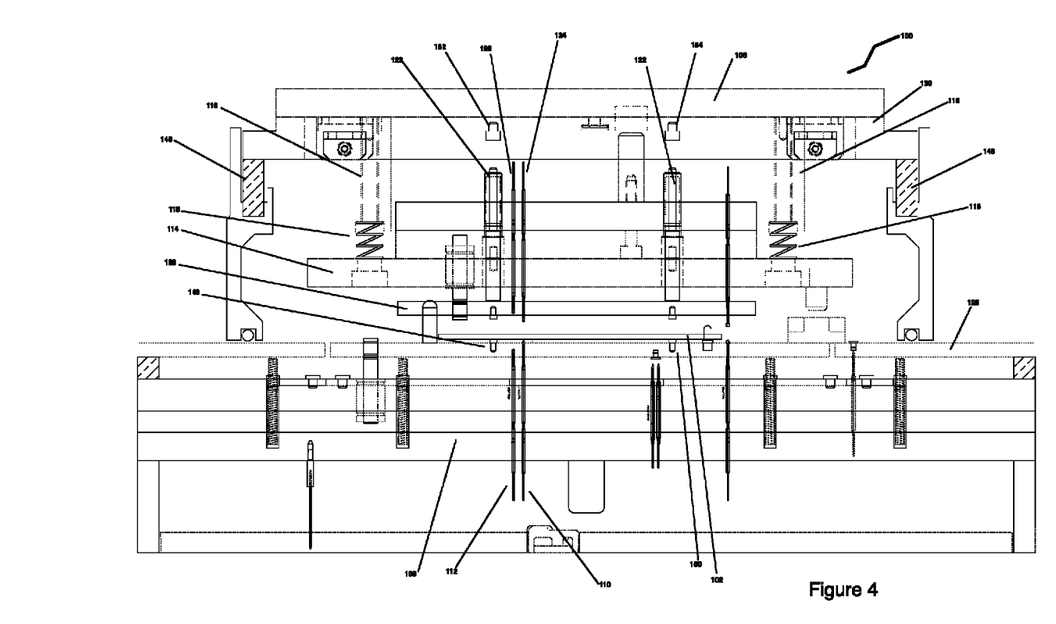
FIG. 4 illustrates additional components of the side plan view of FIG. 1 in a rest configuration.
Figure 7:
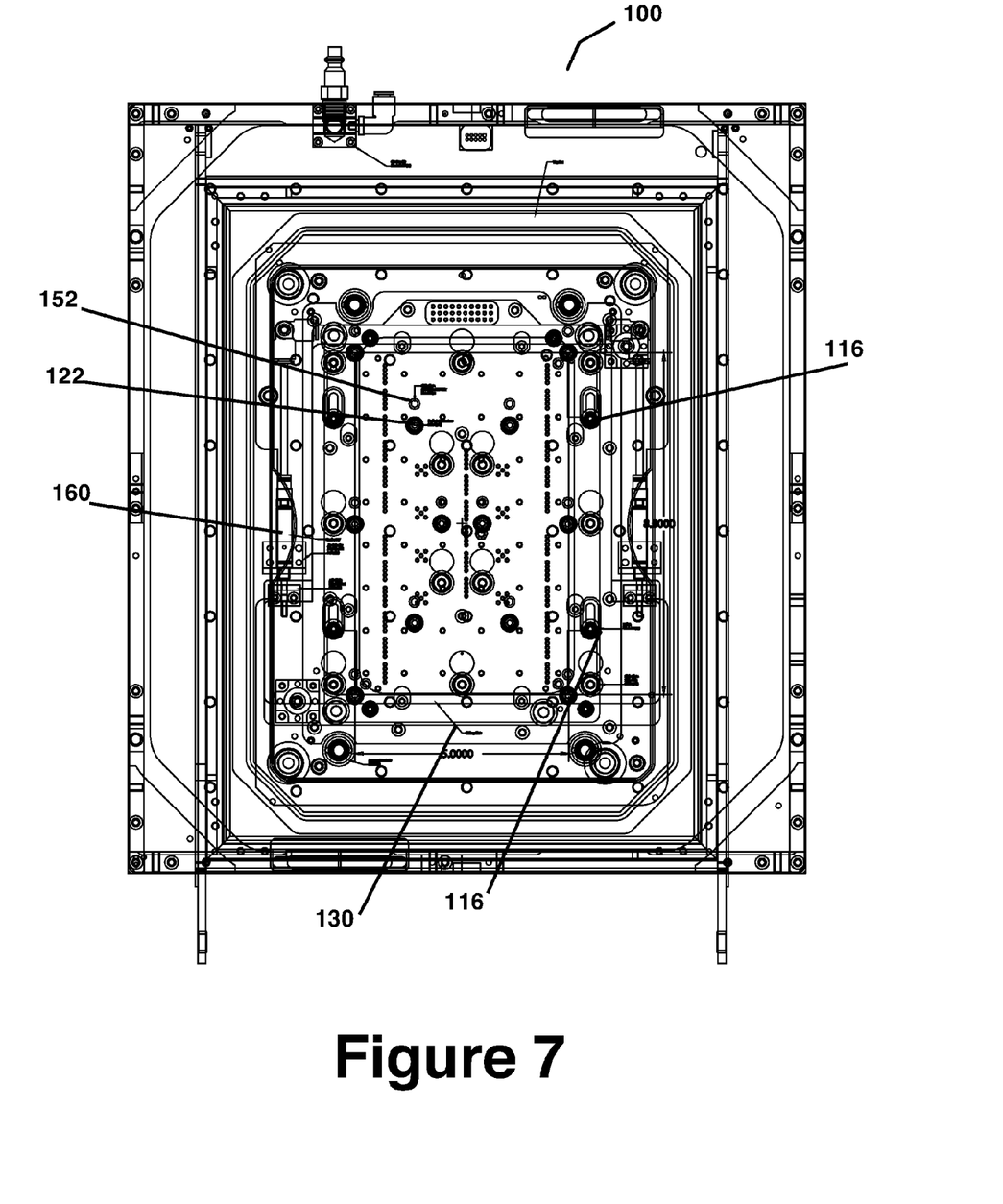
FIG. 7 illustrates a top plan view of the circuit tester of FIG. 1.
Figure 8:
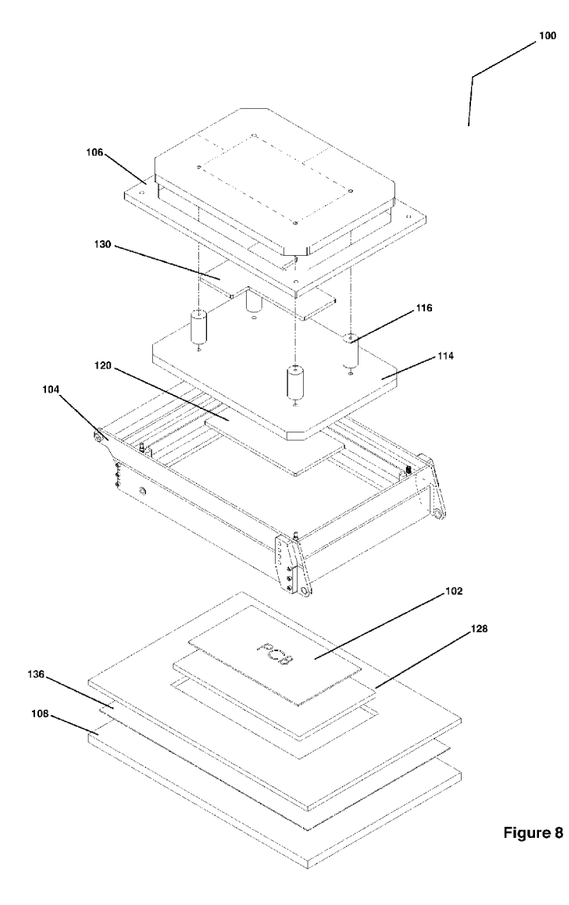
FIG. 8 illustrates an exploded view of the circuit tester of FIG. 1.

FIGS. 1 and 4 illustrate an example circuit tester 100 into which a circuit board 102 can be placed for testing. FIG. 7 shows a top plan view of the circuit tester 100. FIG. 8 shows an exploded view of the circuit tester 100. FIGS. 1 and 4 illustrate the circuit tester 100 in a rest position. The circuit tester includes a housing having a first portion and a second portion that are connected at one edge by an overclamp 104, which serves as a hinge to facilitate access to the circuit board 102. A push plate 106 is mounted to the first portion of the housing. A bottom probe plate 108 is mounted proximate the second portion of the housing. The bottom probe plate 108 has a lower probe field including a number of long-stroke probes 110 and a number of short-stroke probes 112 that are shorter than the long-stroke probes 110.

A jumper plate 114 is mounted to the push plate 106 by a number of rigid support members 116, called jumper plate standoffs. An upper stripper plate 120, which can also perform as a probe plate or adjacent to a probe plate, is mounted to the jumper plate 114 by resilient members 122, which include springs 118. In the embodiment shown in FIG. 4, the upper stripper plate 120 has clearance holes through which an upper probe field can protrude. The upper probe field includes a number of long-stroke probes 124 and a number of short-stroke probes 126 that are shorter than the long-stroke probes 124. These test probes may be of similar or different lengths to the test probes of the lower probe field.

A seal plate (also referred to as a stripper plate) 128 is mounted to the bottom probe plate 108. It is also possible that they built as the same plate so the words can be used interchangeably. The seal plate 128 may have clearance holes through which the lower probe field can protrude. The seal plate 128 and the upper stripper plate 120 may have additional clearance holes through which support members for supporting the circuit board can protrude.

The circuit tester 100 also includes one or more slide plates that are movable to control which test probes can contact the circuit board. An upper slide plate 130 is movable between at least first and second positions, as described more fully below. When the upper slide plate 130 is in the first position, a surface of the upper slide plate 130 contacts the rigid support members 116. The upper stripper plate 120 is spring-loaded, and both the long-stroke probes 124 and the short-stroke probes 126 can contact the circuit board 102. On the other hand, when the upper slide plate 130 is in the second position, apertures 132, 134 formed in the upper slide plate 130 receive the rigid support members 116. Generally members 116 and apertures 123/134 will be coaxially aligned when they pass through, but such coaxial alignment is intended to mean that support passes through the aperture even if the axis is not in the center of the aperture which may occur, for example, in oversized apertures, oblong apertures, or similar apertures. In the preferred embodiment, the apertures are just large enough to receive the support(s). As a result, the upper stripper plate becomes fixed in position, and only the long-stroke probes 124 can contact the circuit board 102. The fixed positioning of the upper stripper plate 120 prevents the short-stroke probes 126 from contacting the circuit board 102 even when there is unbalanced loading of probe pressure between the top and bottom of the circuit board, thereby preventing transient signals from interfering with testing. Notice that the rigid support member(s) can also be attached to at the opposite end (i.e., the slide plate and then the apertures 132 and 134 would be on the jumper and/or stripper plates resulting in the same function in the same way with the same result). Reference to the structure as shown in the figures contemplates both arrangements.

In the embodiment shown in FIG. 1, a lower slide plate 136 located under the seal plate 128 is also movable between first and second positions. The lower slide plate 136 has rigid support members 138, 140 attached to it. When the lower slide plate 136 is in the first position, the rigid support members 138, 140 are received by corresponding apertures 142, 144 formed in the seal plate 128, allowing both the long-stroke test probes 110 and the short-stroke test probes 112 of the lower probe field to contact the circuit board. On the other hand, when the lower slide plate 136 is in the second position, the rigid support members 138, 140 contact a lower surface of the seal plate 128, preventing the short-stroke test probes 112 from making contact with the circuit board. The upper and lower slide plate systems may be constructed essentially the same (though thicknesses shown are different to accommodate space availability). The preferred embodiment contemplates both upper and lower slide plate systems so that two-stage testing can be conducted with probes on the bottom and top. They may operate in unison or separately so that different tests can be conducted on the bottom or top test points on the circuit board in at least four different test modes: top only, bottom only, top simultaneously with bottom or sequentially.

In operation, FIG. 1 shows the circuit tester 100 in a rest position, that is, when no testing is being performed. In this position, no vacuum (or vacuum alternatives) is applied to the circuit tester 100. As a result, a resilient material 146, such as foam or a bellows, is uncompressed. The amount of travel provided by the vacuum can be varied by using materials with different degrees of resiliency, such as more or less rigid foam or a bellows mechanism. With no vacuum applied, the push plate 106 is not urged toward the circuit board 102. The jumper plate 114 does not contact the surface of the rigid support members 116. The upper stripper plate 120 can also be compressed by hand. The circuit board is supported by support pins 148, 150, but preferably no test probes contact the circuit board in rest mode.

Figure 2:
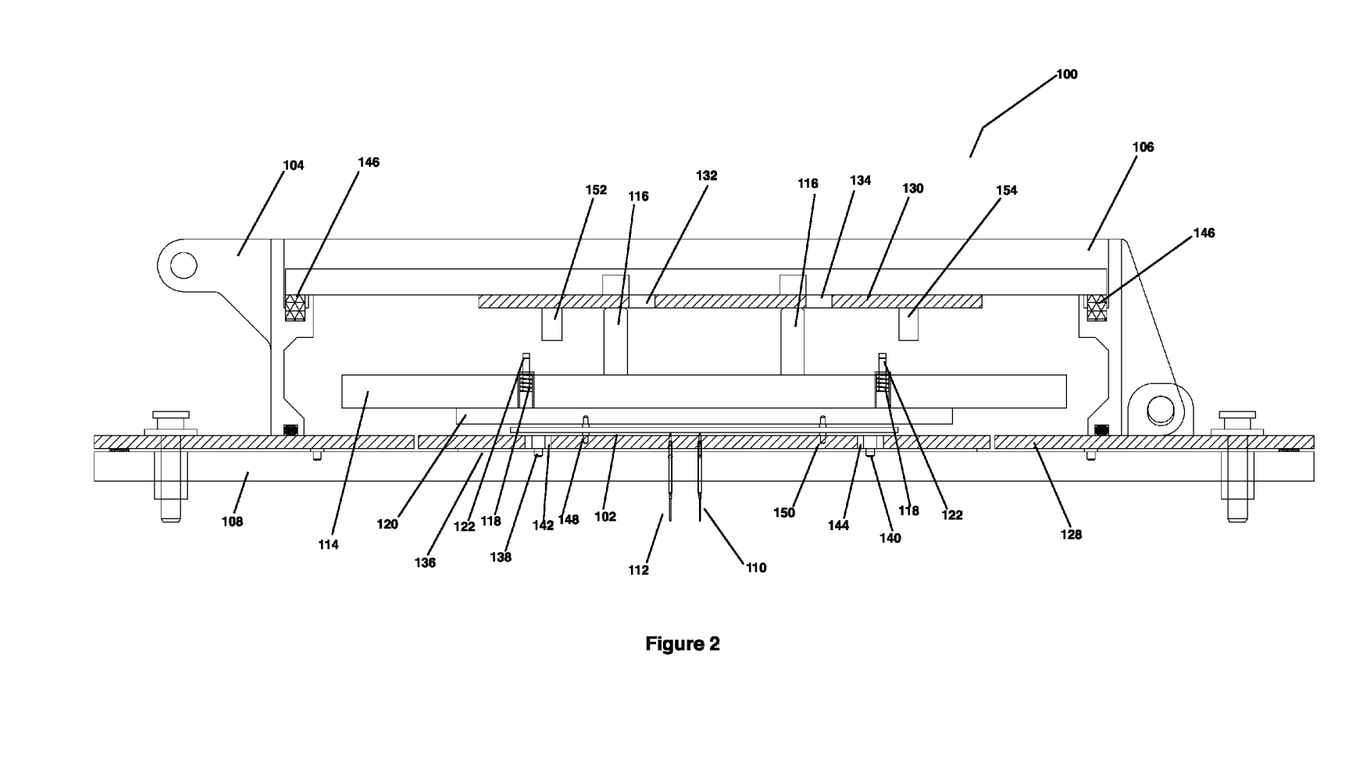
FIG. 2 illustrates a side plan view in section of the circuit tester of FIG. 1 in a first test configuration.
Figure 5:
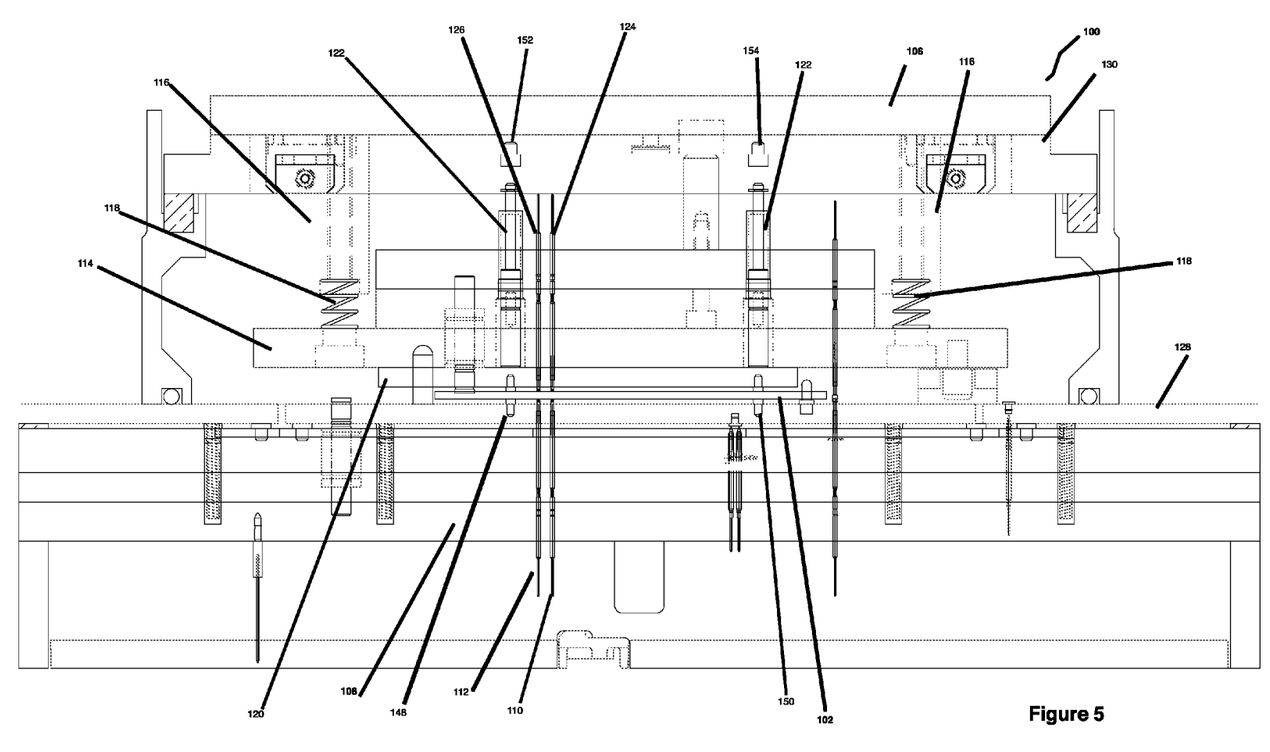
FIG. 5 illustrates additional components of the side plan view of FIG. 2 in first test configuration.

FIGS. 2 and 5 show the circuit tester 100 in a configuration to perform a powered in-circuit test. In this so-called in-circuit test configuration, the upper slide plate 130 is in the first position. As shown in FIG. 2, the rigid support members 116 contact a lower surface of the upper slide plate 130. When the vacuum is applied, the resilient material 146 compresses to form a seal, and the push plate 106 is urged toward the circuit board 102. The jumper plate 114 is effectively set at a low mounting height (maximum travel), allowing both the long-stroke probes 124 and the short-stroke probes 126 of the upper probe field to contact the circuit board 102. The jumper plate 114 does not contact the surface of the rigid support members 116. The lower slide plate 136 is also in the first position. In this position, the rigid support members 138, 140 are received by corresponding apertures or recesses 142, 144 formed in the seal plate 128, allowing both the long-stroke test probes 110 and the short-stroke test probes 112 of the lower probe field to contact the circuit board. After the in-circuit test is performed, the vacuum is released.

Figure 3:
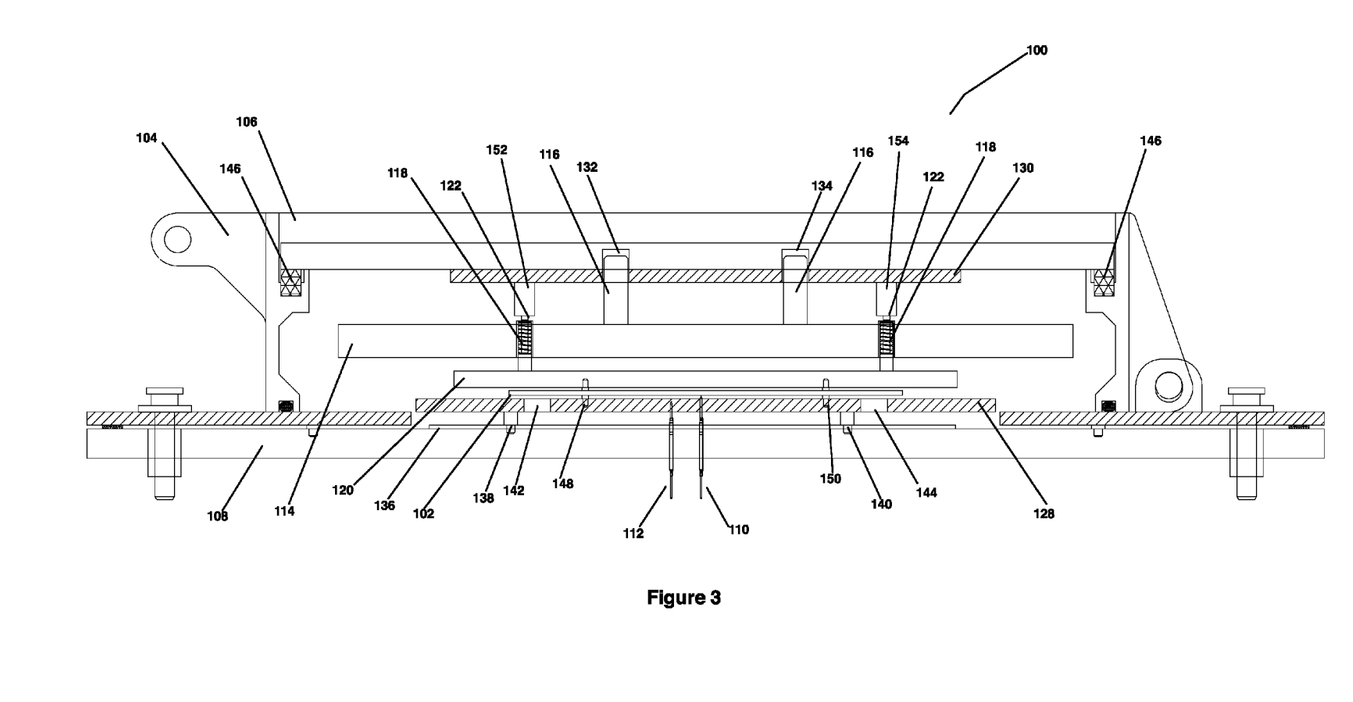
FIG. 3 illustrates a side plan view in section of the circuit tester of FIG. 1 in a second test configuration.
Figure 6:
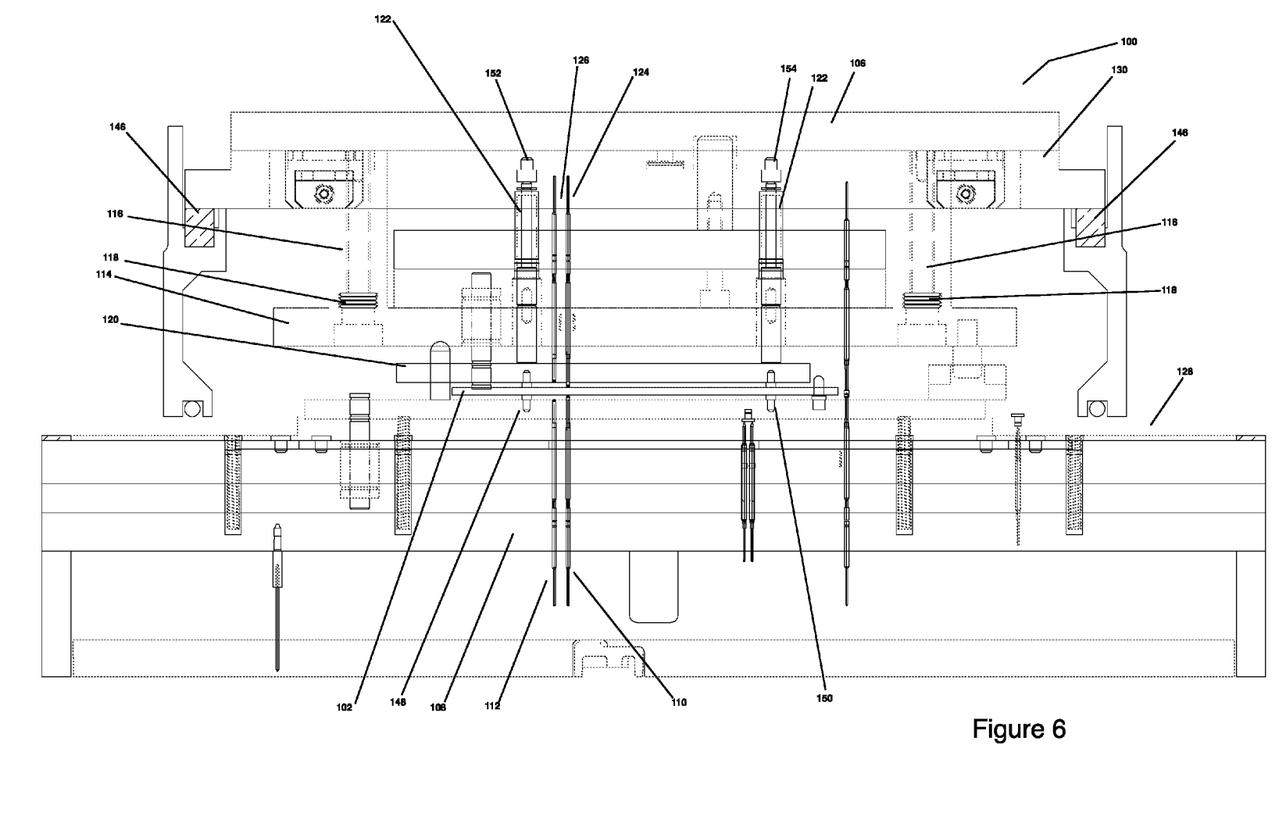
FIG. 6 illustrates additional components of the side plan view of FIG. 3 in second test configuration.

FIGS. 3 and 6 show the circuit tester 100 in a different configuration to perform an unpowered functional test. In this functional test configuration, the upper slide plate 130 is in the second position and the vacuum is again applied. As shown in FIG. 3, the rigid support members 116 are received in the apertures or recesses 132, 134 of the upper slide plate 130. The resilient members/springs 122 come into contact with rigid support members 152, 154 that are secured to the upper slide plate 130. The rigid support member 152, 154 act as dead stops that limit the motion of the resilient members 122 and, as a result, the jumper plate 114 and the upper stripper plate 120. Further, the jumper plate 114 contacts the surface of the rigid support members 116. With the motion of the jumper plate 114 and the upper stripper plate so limited, only the short-stroke test probes 112 of the upper probe field can contact the circuit board 102. The lower slide plate 136 is also in the second position. In this position, the rigid support members 138, 140 encounter the surface of the seal plate 128, preventing the short-stroke test probes 112 of the lower probe field from contacting the circuit board. Only the long-stroke test probes 110 can contact the circuit board during the functional test. After the functional test is performed, the vacuum is released.

The upper slide plate 130 and the lower slide plate 136 can be moved between the first and second positions using any of a variety of mechanisms, including but not limited to, pneumatic, magnet, electromagnetic, manual and gravity. For example, the slide plates can be pneumatically driven using a pneumatic air system including an air cylinder 160, as shown in FIG. 7. Alternatively, the slide plates can be moved using a solenoid. As still another alternative, the slide plates can be moved between the first and second positions manually.

It will be appreciated that, while FIGS. 2 and 3 depict the upper slide plate 130 and the lower slide plate 136 as being movable in unison, in some embodiments, the upper slide plate 130 and the lower slide plate 136 are movable independently of one another. That is, in some embodiments, it is possible for the upper slide plate 130 to be in the first position while the lower slide plate 136 is in the second position, or vice versa. This may allow additional testing protocols to be realized.

In still other embodiments, the upper slide plate 130 and/or the lower slide plate 136 may be movable between more than two positions. In such embodiments, additional levels of testing may be implemented. For example, more than two different probe lengths could be used, with different subsets of test probes contacting the circuit board during different testing protocols.

As demonstrated by the foregoing discussion, various embodiments may provide certain advantages. For instance, with the vacuum applied during the non-powered test, the spring-loaded long-stroke test probes can make a more positive electrical contact with the circuit board.

It will be understood by those who practice the embodiments described herein and those skilled in the art that various modifications and improvements may be made without departing from the spirit and scope of the disclosed embodiments. The scope of protection afforded is to be determined solely by the claims and by the breadth of interpretation allowed by law.

What is claimed is:

1. A circuit tester for testing a circuit board or UUT (unit under test), the circuit tester comprising:
    a housing having first and second parts capable of moving toward and away from each other
    a push plate mounted to the first part of the housing;
    a bottom probe plate mounted proximate the second part of the housing and having a first set of first test probes having a first length and a second set of second test probes having a second length shorter than the first length;
    a jumper plate;
    at least one rigid support members mounting the jumper plate to the push plate, the at least one rigid support member connected to the jumper plate via a respective bias member;
    an upper stripper plate mounted to the jumper plate via a plurality of resilient members;
    a seal plate mounted to the bottom probe plate; and
    a first slide plate selectively movable between a first bypass position and a second blocking position to determine which probes will reach the UUT, the first slide plate having a surface that contacts the rigid support members when the first slide plate is in the first position, the first slide plate having at least one aperture formed and sized to receive a support member when generally aligned to pass therewith therein for receiving the rigid support members when the first slide plate is in the second position to allow the support member to pass therethrough;
    wherein, when the first slide plate is in the first position, the first test probes and the second test probes contact the UUT and, when the first slide plate is in the second position, only the first test probes contact the UUT when the support member are misaligned and cannot pass through the aperture so that they cannot contact the UUT.

2. The circuit tester of claim 1, wherein the jumper plate has a third set of third test probes having a third length and a fourth set of fourth test probes having a fourth length shorter than the fourth length, and wherein the upper stripper plate has a plurality of apertures formed therein for receiving the third test probes and the fourth test probes.

3. The circuit tester of claim 2, wherein the third length is substantially similar to the first length and the fourth length is substantially similar to the second length.

4. The circuit tester of claim 1, wherein the first slide plate is pneumatically driven.

5. The circuit tester of claim 1, further comprising a solenoid arranged to move the first slide plate between the first position and the second position.

6. The circuit tester of claim 1, wherein the first slide plate is manually movable between the first position and the second position.

7. The circuit tester of claim 1, further comprising a second slide plate located under the seal plate and movable between a first position and a second position, the second slide plate having a plurality of rigid members secured thereto, the seal plate having a plurality of apertures formed therein for receiving the rigid members of the second slide plate when the second slide plate is in the first position.

8. The circuit tester of claim 1, wherein the first test probes and the second test probes are spring-loaded.

9. A method for testing a circuit board or UUT (unit under test), the method comprising:
providing a circuit tester comprising
a housing having first and second parts capable of being brought closer together;
a push plate mounted to the first part of the housing;
a bottom probe plate mounted proximate the second part of the housing and having a first set of first test probes having a first length and a second set of second test probes having a second length shorter than the first length;
a jumper plate;
a plurality of rigid support members mounting the jumper plate to the push plate, each rigid support member connected to the jumper plate via a respective spring;
an upper stripper plate mounted to the jumper plate via a plurality of resilient members;
a seal plate mounted to the bottom probe plate; and
a first slide plate movable between a first position and a second position, the first slide plate having a surface that contacts the rigid support members when the first slide plate is in the first position, the first slide plate having a plurality of apertures formed therein for receiving the rigid support members when the first slide plate is in the second position;
placing the UUT in the circuit tester;
applying a force to the circuit tester when the first slide plate is in the first position, thereby causing the first test probes and the second test probes to contact the UUT;
performing an in-circuit test on the UUT;
releasing the force;
moving the first slide plate from the first position to the second position;
applying the force to the circuit tester when the first slide plate is in the second position, thereby causing only the first test probes to contact the UUT; and
performing a functional test on the UUT.

10. The method of claim 9, wherein the jumper plate has a third set of third test probes having a third length and a fourth set of fourth test probes having a fourth length shorter than the fourth length, and wherein the upper stripper plate has a plurality of apertures formed therein for receiving the third test probes and the fourth test probes.

11. The method of claim 10, wherein the third length is substantially similar to the first length and the fourth length is substantially similar to the second length.

12. The method of claim 9, further comprising actuating a pneumatic mechanism to move the first slide plate between the first position and the second position.

13. The method of claim 9, further comprising activating a solenoid to move the first slide plate between the first position and the second position.

14. The method of claim 9, further comprising manually moving the first slide plate is between the first position and the second position.

15. The method of claim 9, wherein the circuit tester further comprises a second slide plate located under the seal plate and movable between a first position and a second position, the second slide plate having a plurality of rigid members secured thereto, the seal plate having a plurality of apertures formed therein for receiving the rigid members of the second slide plate when the second slide plate is in the first position.

16. The method of claim 9, wherein the first test probes and the second test probes are spring-loaded.

17. A method for testing a circuit board or UUT (unit under test), the method in a circuit tester having
first and second parts capable of being brought closer together;
a push plate mounted to the first part;
a probe plate adjacent the push plate for first and second test probes;
a rigid support member attached to either plate at one end; and
a slide plate laterally movable between a first position and a second position, the slide plate having a surface that contacts the rigid support members when the slide plate is in the first position,
the slide plate or probe plate having an apertures for receiving the rigid support member in the second position;
the method comprising the steps of
placing the UUT in the circuit tester;
applying a force to the circuit tester when the slide plate is in the first position, thereby causing the first test probes and the second test probes to contact the UUT;
performing an in-circuit test on the UUT;
releasing at least some force;
moving the slide plate from the first position to the second position;
applying the force to the circuit tester when the slide plate is in the second position, thereby causing only the first test probes to contact the UUT; and
performing a functional test on the UUT.

* * * * *